United States Patent
Westra et al.

(10) Patent No.: US 10,250,338 B1
(45) Date of Patent: Apr. 2, 2019

(54) TRANSMITTER DRIVE WITH IMPROVED TRANSMITTER PERFORMANCE AND RELIABILITY

(71) Applicant: Avago Technologies General IP (Singapore) Pte. Ltd., Singapore (SG)

(72) Inventors: Jan Roelof Westra, Uithoorn (NL); Jan Mulder, Bunnik (NL)

(73) Assignee: Avago Technologies International Sales PTE. Limited, Singapore (SG)

( * ) Notice: Subject to any disclaimer, the term of this patent is extended or adjusted under 35 U.S.C. 154(b) by 0 days.

(21) Appl. No.: 15/961,737

(22) Filed: Apr. 24, 2018

(51) Int. Cl.
*H04B 14/02* (2006.01)
*H04B 14/04* (2006.01)
*H04L 12/931* (2013.01)
*H03M 1/66* (2006.01)
*H04L 25/49* (2006.01)

(52) U.S. Cl.
CPC ............ *H04B 14/042* (2013.01); *H03M 1/66* (2013.01); *H04B 14/026* (2013.01); *H04L 25/4902* (2013.01); *H04L 49/351* (2013.01)

(58) Field of Classification Search
CPC ... H04L 12/28; H04L 12/40136; H04L 12/40; H04L 2012/445; H04L 2012/6454; H04L 25/0286; H04L 49/351; H04L 49/352; H04L 49/353; H04L 49/604; H03M 1/66; H03M 5/02; H03K 17/6871; H03K 17/6872
See application file for complete search history.

(56) References Cited

U.S. PATENT DOCUMENTS

2008/0123771 A1\* 5/2008 Cranford ............. H04L 25/0278
375/285

\* cited by examiner

*Primary Examiner* — Rachel Guarino
(74) *Attorney, Agent, or Firm* — Morgan, Lewis & Bockius LLP

(57) ABSTRACT

An apparatus includes a transmitter circuit coupled to a termination resistor. The transmitter circuit generates a number of link pulses. A driver circuit is coupled to the transmitter circuit to control a dynamic range of the link pulses. A transformer couples the termination resistor via a transmission medium to a far-end transceiver. The driver circuit controls the dynamic range of the link pulses by providing complementary digital input signals to the transmitter circuit, and the complementary digital input signals include ramp sections.

20 Claims, 4 Drawing Sheets

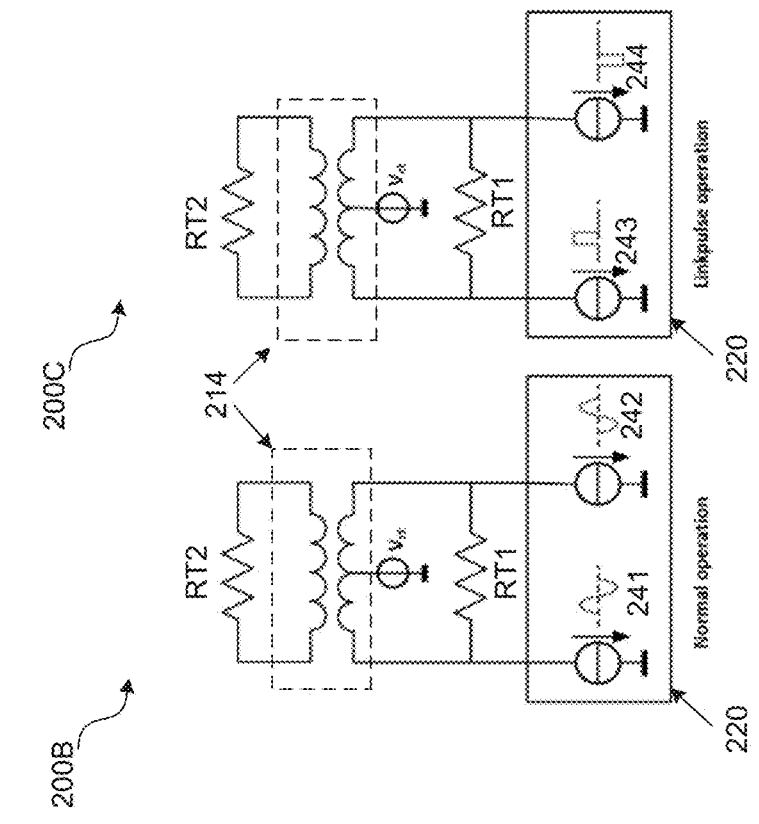
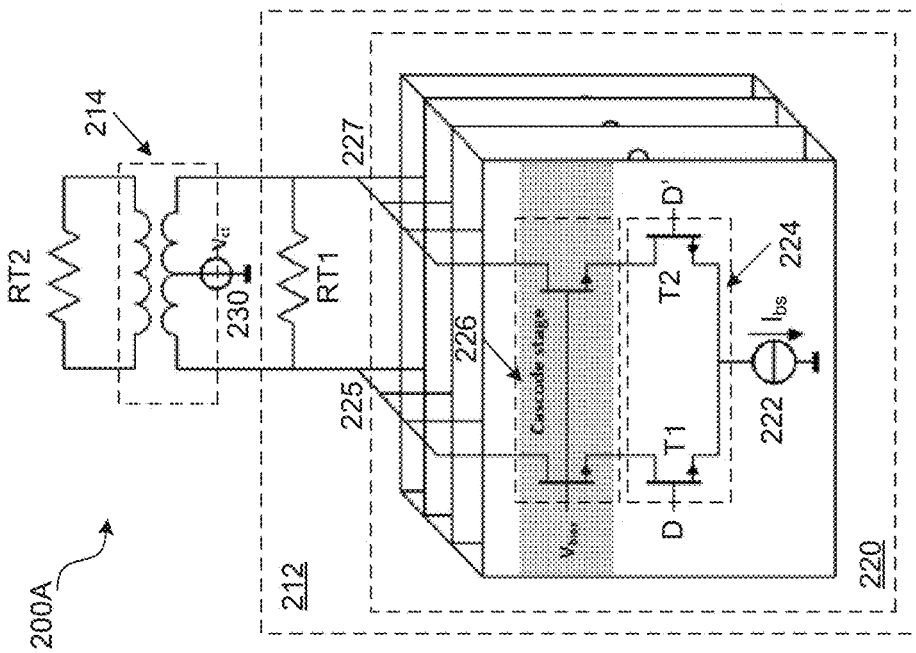
FIG. 2A
FIG. 2B
FIG. 2C

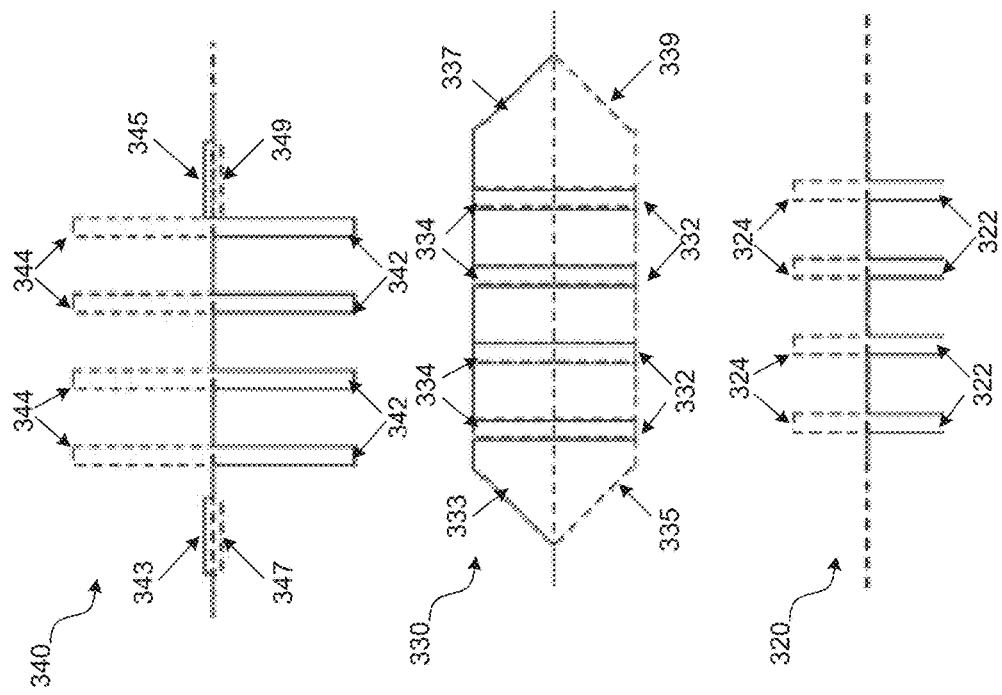
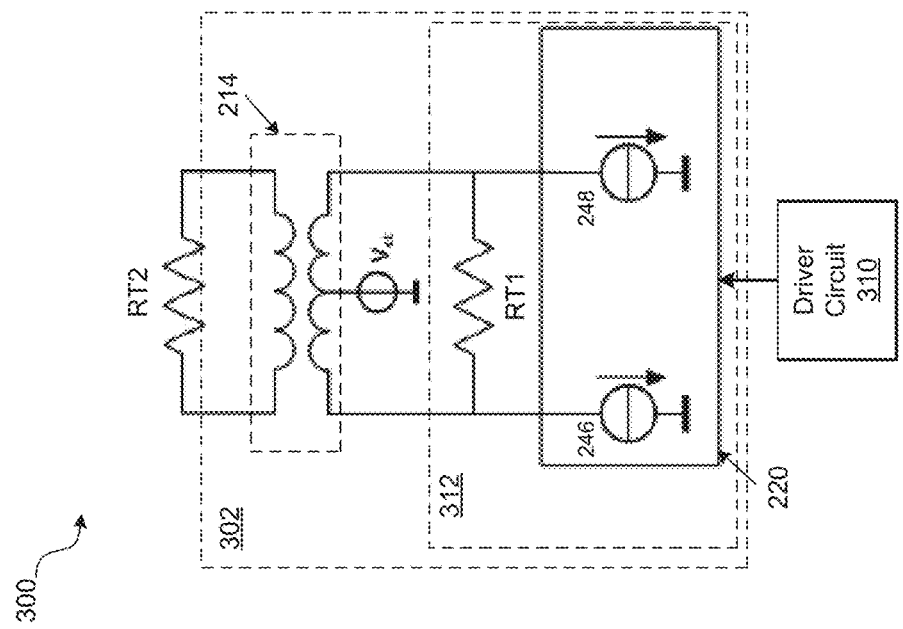
FIG. 3A
FIG. 3B

TRANSMITTER DRIVE WITH IMPROVED TRANSMITTER PERFORMANCE AND RELIABILITY

TECHNICAL FIELD

The present description relates generally to integrated circuits, and more particularly, to a transmitter drive with improved transmitter performance and reliability.

BACKGROUND

New semiconductor integrated circuit (IC) technologies are quite sensitive to overvoltage over active devices. In particular, in new Fin field-effect transistor (FinFET) technologies (e.g., with 16 nm, 10 nm and 7 nm feature sizes) devices are less tolerant to overvoltage events. In wired communication systems, such as Ethernet, handshaking link pulses can, in certain circumstances, cause overvoltage at the transceiver output. For instance, an Ethernet transmitter (TX) may send signals to a far-end receiver (RX), while at the same time the receiver (RX) may receive signals from the far-end transmitter (TX). In order to build up such a full-duplex link, special high-amplitude link pulses can be sent over a connecting medium (e.g., a cable) such that a far-end receiver can recognize these link pulses and start building the link.

The link pulses are backwards compatible to older Ethernet standards, which may use relatively high voltages and currents in the transmitter section of the transceivers. These link pulses are generated by relatively large current excursions in the transmitter output, causing large voltage excursions at the transmitter output. New IC technologies are increasingly sensitive to electro migration in metal layers caused by high currents in these metal layers, which is a reliability issue. Using wider metal traces may help to reliably supply current to the active devices. The wider metal traces, however, exhibit more parasitic capacitance, thus lowering the maximum attainable analog bandwidth.

BRIEF DESCRIPTION OF THE DRAWINGS

Certain features of the subject technology are set forth in the appended claims. However, for purposes of explanation, several embodiments of the subject technology are set forth in the following figures.

FIGS. 2A through 2C are schematic diagrams illustrating example circuits of a transmitter with improved performance and reliability, according to aspects of the subject technology.

FIGS. 3A-3B are a schematic diagram and time diagrams illustrating an example circuit including a transmitter and corresponding digital input pulses and analog output pulses, according to aspects of the subject technology.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without one or more of the specific details. In some instances, structures and components are shown in block diagram form in order to avoid obscuring the concepts of the subject technology.

In one or more aspects of the subject technology, systems and configurations are described for providing a transmitter drive with improved transmitter performance and reliability. The transmitter drive of the subject technology allows reducing current in the output devices of the transmitter without decreasing the output amplitude. The disclosed transmitter prevents high carrier injection (HCI) in the output active devices (e.g., transistors) and precludes electro migration (EM) in the traces connecting these devices. The HCI can lead to a change in the threshold voltage of the active device, which can in turn result in reducing the lifetime of the device. High currents in the output devices can also translate into requiring wider metal traces to connect these devices, in order to reduce electro migration. The wider metal traces increase the parasitic capacitance at the transmitter output, thereby reducing the maximum attainable analog bandwidth. The disclosed solution allows reducing the current in the output devices, without decreasing the output amplitude, thus can effectively reduce both HCI and electro migration in output devices of the wired communication (e.g., Ethernet) transceiver.

Figure 1:
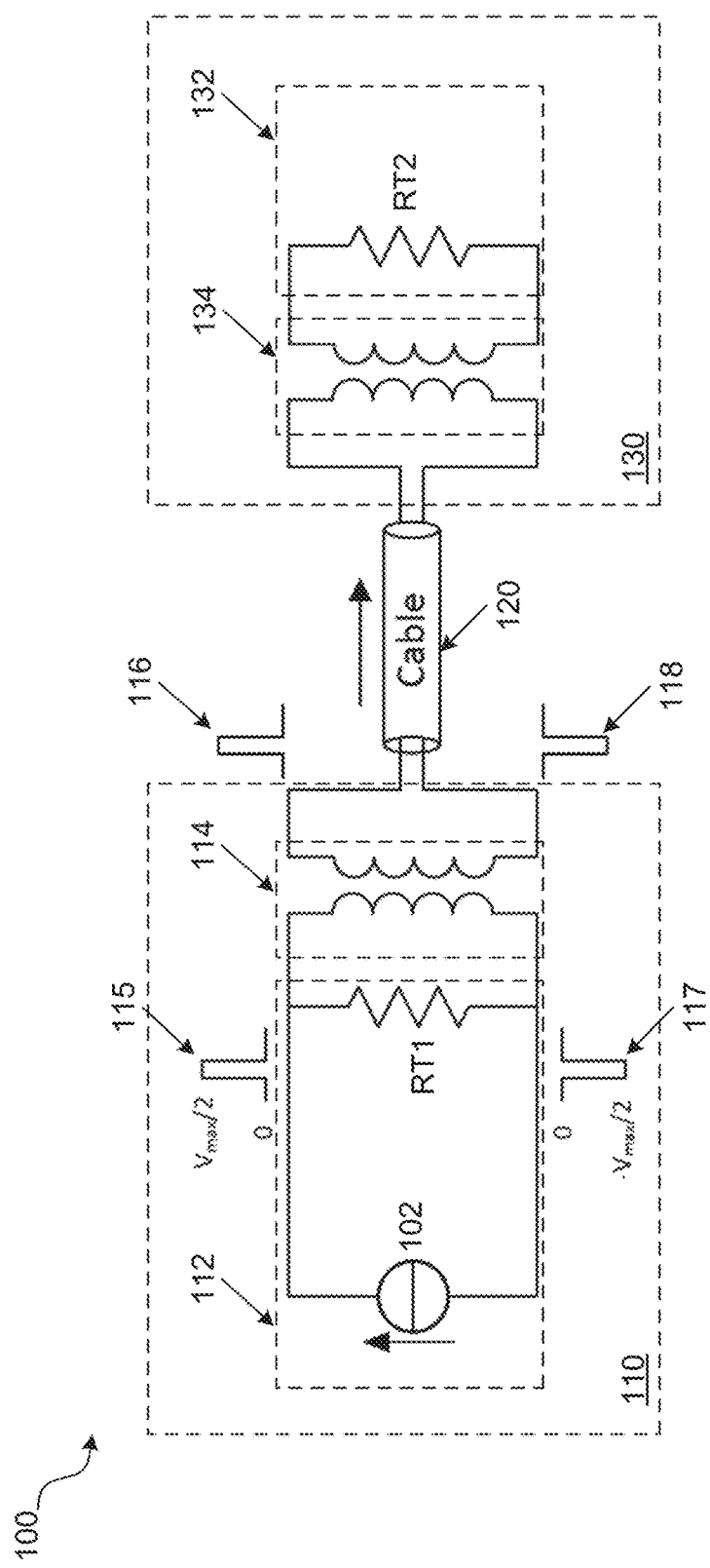
FIG. 1 is a high-level block diagram illustrating an example of an environment in which the subject technology is implemented.

FIG. 1 is a high-level block diagram illustrating an example of an environment 100 in which the subject technology is implemented. Not all of the depicted components may be used in all implementations; however, one or more implementations may include additional or different components than those shown in the figure. Variations in the arrangement and type of the components may be made without departing from the spirit or scope of the claims as set forth herein. Additional components, different components, or fewer components may be provided.

The environment 100 includes a first transceiver 110, a transmission medium 120 and a second transceiver 130. The first transceiver 110 and the second transceiver 130 are near-end and far-end wired communication (e.g., Ethernet) transceivers that are in communication via the transmission medium 120. The transmission medium 120 can be an Ethernet cable formed by a number of twisted wires. At the near end of the environment 100, the first transceiver 110 include a first chip 112 coupled via a first transformer 114 to the transmission medium 120. At the far end of the environment 100, the second transceiver 130 includes a second transformer 134 coupled to the transmission medium 120 and a second chip 132.

The first chip 112 includes a transmitter circuit that is modeled by a current source 102 and can provide current pulses to a first termination resistor RT1. The current pulses provided by the transmitter circuit can produce voltage pulses 115 and 117 at two ends of the first termination resistor RT1 (e.g., 100Ω). The voltage pulses 115 and 117 pass through the first transformer 114 and generate voltage pulses 116 and 118 that can be transmitted by the cable 120 to the second transceiver 130. The voltage pulses 116 and 118 can be link pulses that are used by the first transceiver 110 to establish a communication link with the second transceiver 130. The second transformer 134 of the second transceiver 130 passes the link pulses to a second termination resistor RT2 of the second chip 132. The second termination resistor RT2 is matched with the first termination resistor RT1 to warrant an efficient signal coupling between the front-end and the far-end transceivers.

Many wired communication systems, such as Ethernet, may use relatively high voltages (e.g., voltage pulses 116 and 118) on the transmission medium (e.g., 120). In particular, this is the case with a communication system (e.g., Ethernet) that is backward compatible. In that case, for example, voltage pulses have to be generated and tolerated that are not necessarily compatible with the current IC technologies (e.g., 16 nm and beyond). For instance, Ethernet builds up a link by sending special link pulses on the transmission medium (e.g., copper). These link pulses can be backward compatible to older Ethernet standards and use relatively high voltages and currents in the transmitter section of the transceivers. These link pulses are generated by large current excursions in the transmitter output (e.g., RT1), causing large voltage excursions (e.g., 115 and 117) at the transmitter output devices.

The subject technology provides a solution for reducing (e.g., by a factor of about two) the currents in the output devices, without decreasing the output amplitude to reduce both HCI and electro migration in output devices of the Ethernet transceiver (e.g., 110). The output devices are not shown in the first chip 112, as they are embedded in the current source 102 and will be described in more detail below. The electro migration can occur in metal traces connecting to the output devices or from the output devices to the termination resistor RT1. Reducing the current in the output devices by the subject technology result in reducing (e.g., by a factor of about two) currents in these metal traces. With reduced current, the width of the metal traces can be kept unchanged, thus precluding almost doubling of corresponding parasitic capacitances if wider metal traces were to be used. More detailed description of the Ethernet transmitter (e.g., of first chip 112), in which the subject technology is implemented are provided herein.

FIGS. 2A through 2C are schematic diagrams illustrating example circuits 200A through 200C of a transmitter with improved performance and reliability, according to aspects of the subject technology. Not all of the depicted components may be used in all implementations; however, one or more implementations may include additional or different components than those shown in the figure. Variations in the arrangement and type of the components may be made without departing from the spirit or scope of the claims as set forth herein. Additional components, different components, or fewer components may be provided.

The building blocks of a transmitter of a wired transceiver (e.g. 110 of FIG. 1) includes a digital-to-analog circuit that receives digital signals from the baseband and converts the digital signals to an analog output voltage or current delivered to the termination resistor (e.g., RT1) for transmission through the transmission medium (e.g., 120 of FIG. 1) to a the far-end transceiver (e.g., 130 of FIG. 1).

The example circuit 200A of FIG. 2A illustrates a wired transmitter 212 coupled via a transformer 214 to a second termination resistor RT2 of a far-end transceiver (e.g., 130 of FIG. 1). The transformer 214 is center tapped via a source 230 to a ground potential. The transmission medium (e.g., 120 of FIG. 1) and the second transformer (e.g., 134 of FIG. 1) are not shown in FIGS. 2A through 2C for simplicity. The wired transmitter 212 includes, but is not limited to, a DAC circuit 220 that is coupled at output nodes 225 and 227 to a termination resistor RT1 (e.g., 100Ω). The DAC 220 is formed by a number of DAC cells including a few (e.g., 3) binary DAC cells and a large number (e.g., more than 64) of unary DAC cells. Each DAC cell includes a current source 222, a switching stage 224 and a cascode stage 226.

The switching stage 224 includes switches (e.g., transistors) T1 and T2. In one or more implementations, the switches T1 and T2 are metal-oxide semiconductor (MOS) transistors, for example, N-type MOS (NMOS) transistors, but are not limited to NMOS transistors. The complementary digital data (signals) D and D' are applied to gate modes of the transistors T1 and T2, respectively. The complementary digital signals D and D' can control the current passing through the cascode devices without changing the bias current $I_{bs}$ of the current source 222.

The subject technology can reduce (e.g., by a factor of about two) the current passing through the cascode stage 226 by changing the complementary digital signals D and D'. This results in preventing HCI in transistor of the cascode stage 226 and precluding electron migration in metal traces connecting, for example, the cascode stage 226 to the switching stage 224, the termination resistor RT1 and the transformer 214. For constant output pulse amplitude, this translates into reducing the parasitic capacitance at the transmitter output, thereby increasing the maximum attainable analog bandwidth of the transmitter.

The example circuit 200B of FIG. 2B shows the DAC circuit 220, first termination resistor RT1, transformer 214 and the second termination resistor RT2 along with signal 241 and 242 during normal operation of the transmitter of circuit 200B, when the DAC outputs are controlled around the bias point. The signals 241 and 242 depict complementary signal currents passing through the first termination resistor RT1, which generate similar differential output signals during normal operation of the transmitter of circuit 200C.

The example circuit 200C of FIG. 2C is similar to the example circuit 200B, except that the signals 243 and 244 are link pulses generated by the DAC circuit 220 during a link-pulse operation. Again, the signals 243 and 244 depict complementary pulse currents passing through the first termination resistor RT1, which generate similar output link pulse voltages during the link-pulse operation of the DAC circuit 220. During the link-pulse operation of the DAC circuit 220, due to the highly asymmetrical nature of the signals (e.g., link pulses) 243 and 244, only half of the dynamic range of the DAC circuit 220 is used. In the absence of the driver circuit of the subject technology (to be described below), in order to fully use the dynamic range of the DAC 220, currents in the output DAC 220 could be cut by a factor of about two. The transmitter driver circuit of the subject technology allows using the full dynamic range of the DAC circuit 220 without such penalty.

FIGS. 3A-3B are a schematic diagram and time diagrams illustrating an example circuit 300 including a transmitter and corresponding digital input pulses 320 and 330 and analog output pulses 340, according to aspects of the subject technology. Not all of the depicted components may be used in all implementations; however, one or more implementations may include additional or different components than those shown in the figure. Variations in the arrangement and type of the components may be made without departing from the spirit or scope of the claims as set forth herein. Additional components, different components, or fewer components may be provided.

The circuit 300 includes a transmitter output stage 302 coupled through a transmission medium (not shown for simplicity) to a termination resistor RT2 of a far-end transceiver, and a drive circuit 310. The transmitter output stage 302 is similar to the circuit 200A of FIG. 2A and includes a transmitter 312 coupled via a transformer 214 to a second termination resistor RT2 of the far-end transceiver. The transmitter 312 is similar to the transmitter 212 of FIG. 2A and includes a DAC circuit 220 formed of a number of DAC cells as described above. The DAC cells are represented by two current sources 246 and 248, which provide the output currents of the DAC circuit 220. The drive circuit 310 is a digital drive circuit including suitable logic, circuitry and/or code that may be operable to generate a desired digital input pulse that can cause the DAC circuit 220 to provide output link pulses that have a dynamic range that is twice as large as the dynamic range of a conventional DAC circuit similar to the circuit 200C of FIG. 2C.

The time diagram 320 of FIG. 3B shows input pulses of a conventional DAC circuit without the drive circuit 310 of the subject technology, when the DAC circuit is operating in a link pulse mode. The pulse sequence formed of positive pulses 324 are applied to one of the input nodes (e.g., D of FIG. 2A) and the pulse sequence formed of negative pulses 322 are applied to the other input node (e.g., D' of FIG. 2A). The output pulses of the DAC circuit 220 corresponding to the input pulses of the time diagram 320 are as shown by 243 and 244 of FIG. 2C that, as described above, cannot use the full dynamic range of the DAC circuit 220.

The time diagram 330 of FIG. 3B shows input pulses of the DAC circuit 220 as generated by the digital drive circuit 310 of the subject technology, when the DAC circuit is operating in a link pulse mode. The pulse sequence formed of positive pulses 334 are applied to one of the input nodes (e.g., D of FIG. 2A) and the pulse sequence formed of negative pulses 332 are applied to the other input node (e.g., D' of FIG. 2A). The positive pulses 334 include an increasing initial-ramp section 333 and a decreasing end-ramp section 337. During the initial-ramp section 333, the input increases slowly from zero to a peak value and during the end-ramp section 337, the input slowly decreases from the peak value to zero. The negative pulses 332 include a decreasing initial-ramp section 335 and an increasing end-ramp section 339. During the initial-ramp section 335, the input decreases slowly from zero to a negative peak value and during the end-ramp section 339, the input slowly increases from the negative peak value to zero. The result of applying the input pulses of the time diagram 330 to the input nodes (e.g., D and D' of FIG. 2A) of the DAC circuit 220 is an analog output pulse sequence as shown in the time diagram 340.

The time diagram 340 of FIG. 3B shows output pulses (e.g., link pulses) of the DAC circuit 220 as generated by the digital drive circuit 310 of the subject technology, when the DAC circuit 220 is operating in a link pulse mode. The positive link pulses 344 and negative link pulses 342 of the time diagram 340, are twice as large as the corresponding link pulses generated by the conventional input pulses of the time diagram 320 and use the full dynamic range of the DAC circuit 220. The residual pulses 343 and 347 are due to the initial-ramp sections 333 and 335, and the residual pulses 345 and 349 are due to the end-ramp sections 337 and 339 of the time diagram 330. Due to the high-pass nature of the current-to-voltage transfer at both input and output of the transformer 214, the output voltage is twice as large with the same total output bias current. After the link pulses, the output of the DAC circuit 220 is controlled back to its center for the normal operation. In view of the above discussion, for yielding the same output amplitude as in the conventional method, the use of the drive circuit of the subject technology lowers the bias current by a factor of two. The reduction of the bias current by a factor of two would greatly relax the requirements for both HCI and electro migration.

Figure 4:
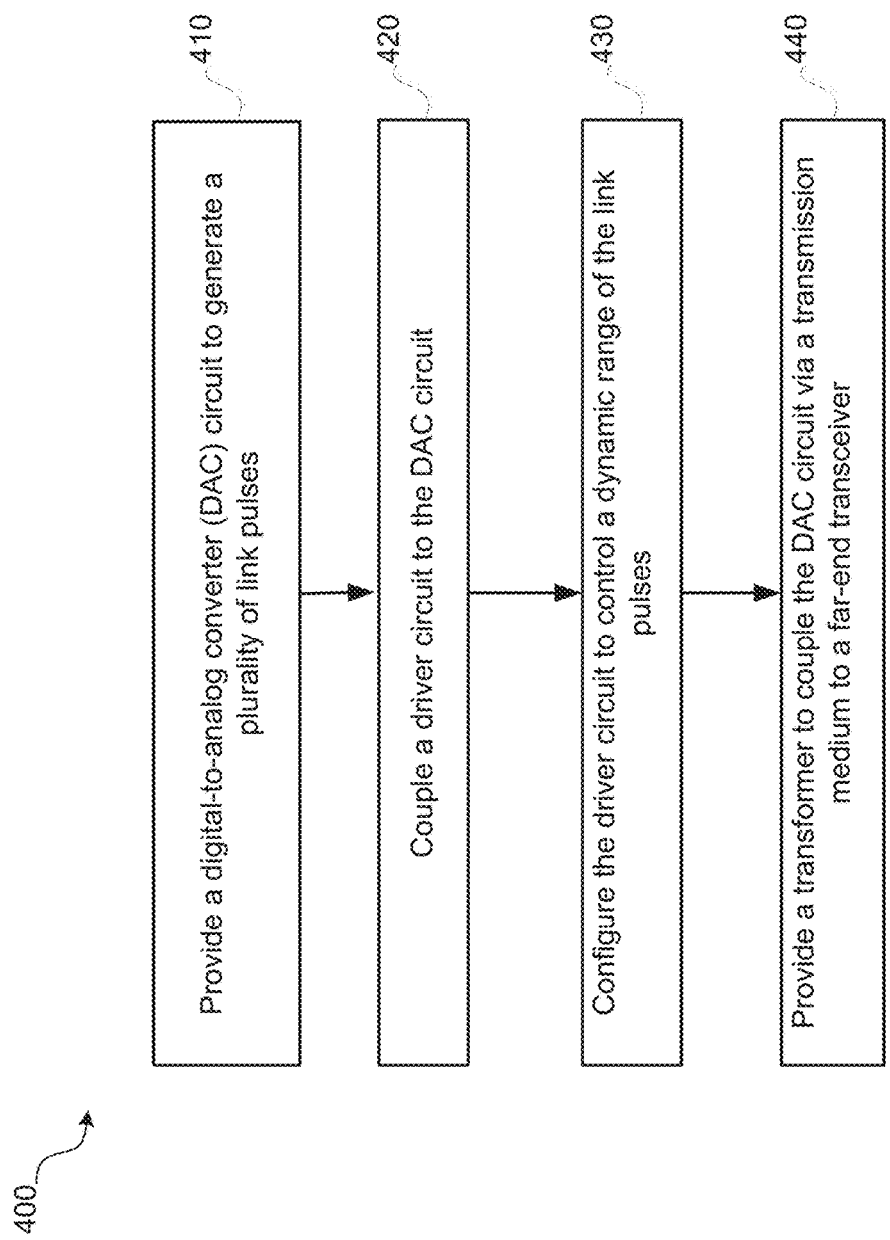
FIG. 4 is a flow diagram illustrating an example of a method of providing a wired communication transmitter with improved performance, according to aspects of the subject technology.

FIG. 4 is a flow diagram illustrating an example method 400 of providing a wired communication transmitter with improved performance, according to aspects of the subject technology. The method 400 includes providing a digital-to-analog converter (DAC) circuit (e.g., 220 of FIG. 2A) to generate a number of link pulses (e.g., 340 of FIG. 3B) (410). The method further includes coupling a driver circuit (e.g., 330 of FIG. 3A) to the DAC circuit (e.g., 220 of FIG. 3A) (420). The driver circuit can control a dynamic range of the plurality of link pulses (430). A transformer (e.g., 114 of FIG. 1) is provided to couple the DAC circuit via a transmission medium (e.g., 120 of FIG. 1) to a far-end transceiver (e.g., 130 of FIG. 1) (440). Controlling the dynamic range of the link pulses is by providing complementary digital input signals (e.g., of time diagram 330 of FIG. 3B) to the DAC circuit, and the complementary digital input signals include ramp sections (e.g., 333, 335, 337 and 339 of FIG. 3B).

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. An apparatus comprising:
A transmitter circuit coupled to a termination resistor, the transmitter circuit configured to generate a plurality of link pulses;
a driver circuit coupled to the transmitter circuit and configured to control a dynamic range of the link pulses; and
a transformer configured to couple the termination resistor via a transmission medium to a far-end transceiver,
wherein the driver circuit is configured to control the dynamic range of the link pulses by providing complementary digital input signals to the transmitter circuit, and wherein the complementary digital input signals include ramp sections.

2. The apparatus of claim 1, wherein the ramp sections comprise an increasing initial-ramp section and a decreasing end-ramp section, wherein durations of the increasing initial-ramp section and the decreasing end-ramp section are comparable with a period of the link pulses.

3. The apparatus of claim 2, wherein the transmitter circuit comprises a digital-to-analog converter (DAC) circuit, and wherein during the increasing initial ramp section a first current of the DAC circuit is increased to a positive peak value and a second current of the DAC circuit is decreased to a negative peak value.

4. The apparatus of claim 1, wherein the transmitter circuit comprises a digital-to-analog converter (DAC) circuit, and wherein the driver circuit is configured to increase the dynamic range of the link pulses by approximately a factor of two, without increasing bias currents of the DAC circuit.

5. The apparatus of claim 1, wherein the transmitter circuit comprises a digital-to-analog converter (DAC) circuit, wherein the DAC circuit comprises a plurality of DAC cells, and wherein each DAC cell includes a switching stage coupled to a cascode stage.

6. The apparatus of claim 5, wherein the driver circuit is configured to provide the complementary digital input signals to input nodes of the switching stage.

7. The apparatus of claim 1, wherein the apparatus comprises a wired communication transceiver, wherein the wired communication transceiver includes an Ethernet transceiver.

8. The apparatus of claim 1, wherein the far-end transceiver comprises a wired communication transceiver, wherein the wired communication transceiver includes an Ethernet transceiver.

9. The apparatus of claim 1, wherein the transmission medium comprises a cable including twisted wires.

10. A method of providing a wired communication transmitter with improved performance, the method comprising:
providing a transmitter circuit to generate a plurality of link pulses;
coupling a driver circuit to the transmitter circuit;
configuring the driver circuit to control a dynamic range of the plurality of link pulses; and
providing a transformer to couple the transmitter circuit via a transmission medium to a far-end transceiver,
wherein controlling the dynamic range of the plurality of link pulses is by providing complementary digital input signals to the transmitter circuit, and wherein the complementary digital input signals include ramp sections.

11. The method of claim 10, further comprising configuring the driver circuit to provide an increasing initial-ramp section and a decreasing end-ramp section, wherein durations of the increasing initial-ramp section and the decreasing end-ramp section are comparable with a period of the link pulses.

12. The method of claim 11, wherein the transmitter circuit comprises a digital-to-analog converter (DAC) circuit, and wherein the method further comprises configuring the driver circuit to increase a first current of the DAC circuit to a positive peak value and to decrease a second current of the DAC circuit to a negative peak value, during the increasing initial-ramp section.

13. The method of claim 12, further comprising configuring the driver circuit to increase the dynamic range of the link pulses by approximately a factor of two, without increasing bias currents of the DAC circuit.

14. The method of claim 12, further comprising providing the DAC circuit by implementing a plurality of DAC cells, wherein each DAC cell includes a switching stage coupled to a cascode stage.

15. The method of claim 14, further comprising configuring the driver circuit to provide the complementary digital input signals at input nodes of the switching stage.

16. A wired communication device comprising:
a transmitter circuit configured to generate a plurality of link pulses;
a driver coupled to the transmitter circuit and configured to control a dynamic range of the link pulses; and
a transformer configured to couple the transmitter circuit via a transmission medium to a far-end transceiver,
wherein the driver is configured to control the dynamic range of the link pulses by providing complementary digital input signals to a switching stage of the transmitter circuit, and wherein the complementary digital input signals include ramp sections.

17. The wired communication device of claim 16, wherein the ramp sections comprise an increasing initial-ramp section and a decreasing end-ramp section, wherein durations of the increasing initial-ramp section and the decreasing end-ramp section are comparable with a period of the link pulses.

18. The wired communication device of claim 17, wherein the transmitter circuit comprises a digital-to-analog converter (DAC) circuit, and wherein during the increasing initial-ramp section a first current of the DAC circuit is increased to a positive peak value and a second current of the DAC circuit is decreased to a negative peak value.

19. The wired communication device of claim 18, wherein the driver is configured to increase the dynamic range of the link pulses by approximately a factor of two, without increasing bias currents of the DAC circuit.

20. The wired communication device of claim 16, wherein the driver is configured to provide the complementary digital input signals at input nodes of the switching stage.

* * * * *